United States Patent
Park et al.

(10) Patent No.: US 6,753,252 B2
(45) Date of Patent: Jun. 22, 2004

(54) CONTACT PLUG FORMATION FOR DEVICES WITH STACKED CAPACITORS

(75) Inventors: Youngjin Park, Kyungki-do (KR); Heon Lee, Sunnyvale, CA (US); David E. Kotecki, Orono, ME (US); Greg Costrini, Hopewell Junction, NY (US)

(73) Assignees: Infineon Technologies AG, Munich (DE); International Business Machines Corp, Armonk, NY (US)

( * ) Notice: Subject to any disclaimer, the term of this patent is extended or adjusted under 35 U.S.C. 154(b) by 0 days.

(21) Appl. No.: 09/861,253

(22) Filed: May 18, 2001

(65) Prior Publication Data

US 2002/0173094 A1 Nov. 21, 2002

(51) Int. Cl.[7] .............................................. H01L 21/44

(52) U.S. Cl. ...................... 438/672; 438/612; 438/659; 438/669; 438/241; 438/240; 438/239

(58) Field of Search ................................. 438/612, 659, 438/669, 672, 241, 240, 239, 238, 157, 618, 597

(56) References Cited

U.S. PATENT DOCUMENTS

| | | | | |
|---|---|---|---|---|
| 5,858,831 A | * | 1/1999 | Sung | 438/241 |
| 5,960,318 A | | 9/1999 | Peschke et al. | 438/637 |
| 6,103,592 A | | 8/2000 | Levy et al. | 438/424 |
| 6,261,897 B1 | * | 7/2001 | Fukase et al. | 438/241 |
| 6,358,829 B2 | * | 3/2002 | Yoon et al. | 438/597 |
| 2002/0111005 A1 | * | 8/2002 | Hsu et al. | 438/612 |

* cited by examiner

*Primary Examiner*—George Fourson
*Assistant Examiner*—Julio J. Maldonado

(57) ABSTRACT

Methods for fabricating a semiconductor device are disclosed. Parallel gate structures are formed on a substrate with spaces between the gate structures. A blanket depositing of a conductive material is performed to fill the spaces and cover the gate structures such that contact with the substrate is made by the conductive material. A mask is patterned to remain over active area regions. The mask remains over the spaces. The conductive material is removed in accordance with the mask to provide contacts formed from the conductive material which fills the spaces over the active areas. A dielectric layer is deposited over the gate structures and over the contacts. Holes down to the contacts are formed, and a conductive region is connected to the contacts through the holes.

15 Claims, 8 Drawing Sheets

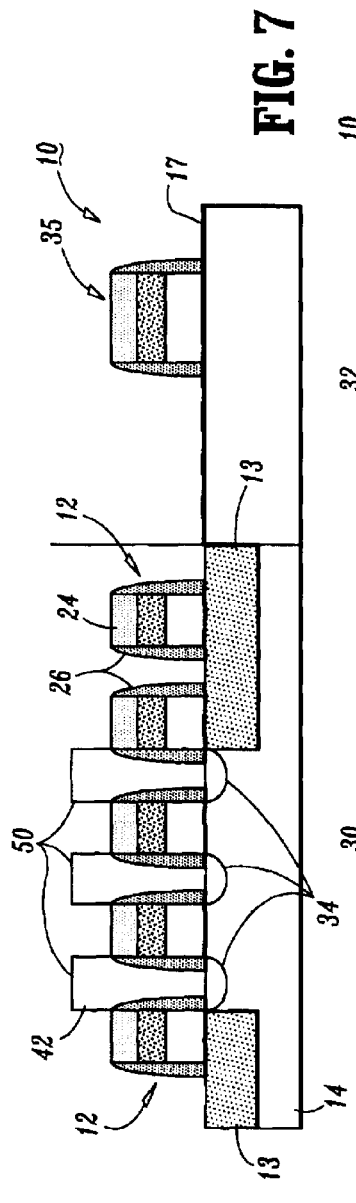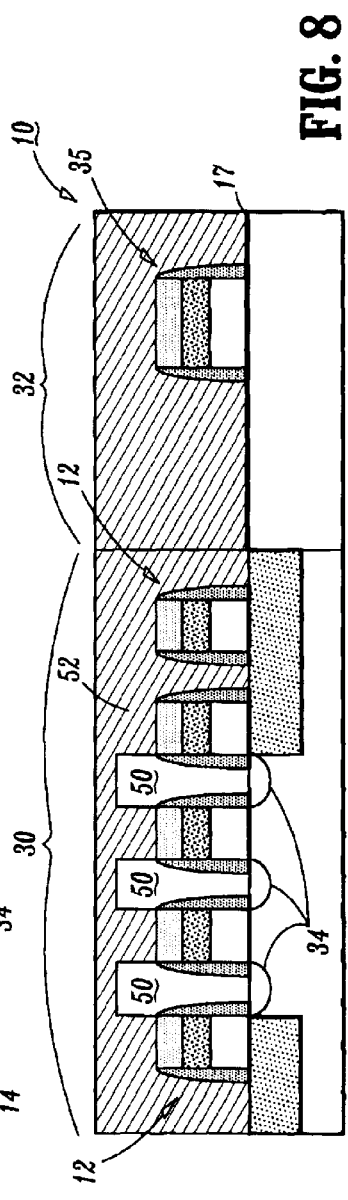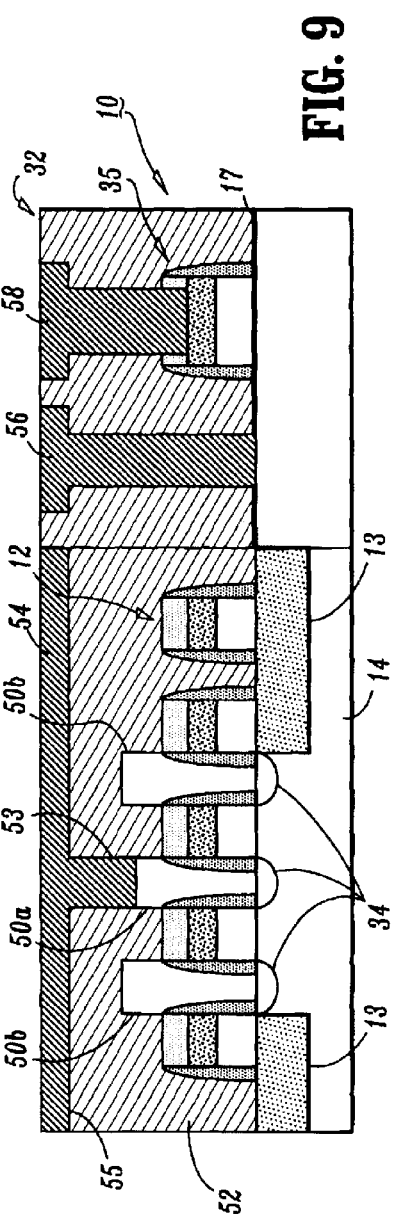

CONTACT PLUG FORMATION FOR DEVICES WITH STACKED CAPACITORS

BACKGROUND

1. Technical Field

This disclosure relates to semiconductor fabrication, and more particularly, to a device and method which provide a plug for a stacked capacitor having lower bitline/wordline capacitance, reduced gate conductor height and improved short yields.

2. Description of the Related Art

Stacked capacitors are known in the art as a capacitor, which extends over an active area (AA) level and a gate conductor (GC) level of a semiconductor memory device. After gate stack layers are deposited and patterned to form wordlines, cap and spacer dielectric layers are deposited to isolate the wordlines from surrounding devices to form gate structures. Gate structures are formed on the substrate in a regular line and space arrangement to isolate one word line from an adjacent word line.

Dielectric materials, such as, boro-phospor silicate glass (BPSG) are deposited over the gate structures to fill in the spaces between word lines thus insulating the gate structures.

In a separate lithographic process, a resist layer is formed over the dielectric layer and lithographically patterned. Holes are etched through the dielectric layer to open up selected gaps down to the substrate. The resist is removed, and polysilicon plugs and bitline contacts are formed by depositing polysilicon in the newly formed holes in contact with the substrate. Polysilicon is then polished from the surface of the dielectric layer. The polysilicon plug is connected to lower electrode of the stacked capacitor in subsequent steps followed by a the formation of a capacitor dielectric and upper electrode. The bitline contacts connect bitlines to the substrate.

To be able to employ a dielectric material, such as BPSG, which fills in gaps and provided a relatively planar top surface, a material, such as silicon nitride must be employed for spacers and cap dielectric layers. This permits the selective removal of BPSG to form holes for polysilicon plugs without contacting the side of the polysilicon gates. However, etching the holes in the BPSG layer subjects spacers and cap dielectric layers to an additional etch step. Although the etching is selective to silicon nitride, some silicon nitride is removed by the etch process, hence, thinning the dielectric between the gate conductor (wordlines) and plugs or bitline contacts. This often results in increased capacitive coupling between bitlines and wordlines. Also, the BPSG etch process gives rise to higher probability for short failures of, e.g., bitline contacts to wordlines and hence directly affects chip yield.

Therefore, a need exists for a device and method, which prevents thinning of spacers and cap (or liner) dielectric layers formed on gate structures. A further need exists for an improved method of forming polysilicon plugs and bitline contacts which reduces or avoids the problems of the prior art.

SUMMARY OF THE INVENTION

Methods for fabricating a semiconductor device are disclosed. Parallel gate structures are formed on a substrate with spaces between the gate structures. A blanket depositing of a conductive material is performed to fill the spaces and cover the gate, structures such that contact with the substrate is made by the conductive material. A mask is patterned to remain over active area regions. The mask remains over the spaces. The conductive material is removed in accordance with the mask to provide contacts formed from the conductive material which fills the spaces over the active areas. A dielectric layer is deposited over the gate structures and over the contacts. Holes down to the contacts are formed, and a conductive region is connected to the contacts through the holes.

In alternate embodiments, the contacts may include plugs for stacked capacitors and/or bitline contacts. The conductive material may include polysilicon. The gate structures may include dielectric caps and spacers formed from an oxide and the step of removing the conductive material may include etching polysilicon selective to the oxide of the caps and spacers of the gate structures. The step of removing the conductive material may include the step of removing the conductive material in accordance with the mask to provide contacts extending above a height of the gate structures. The step of patterning a mask may include the step of patterning the mask into stripes running parallel to the gate structures over the spaces.

The step of patterning a mask may include the step of patterning the mask into a same shape as an layout area occupied by active areas in the substrate, the mask extending over the gate structures and over the spaces. The conductive material remaining in accordance with the mask may provide contacts formed having a height the same as or greater than a height of the gate structures in the spaces over the active areas.

These and other objects, features and advantages of the present invention will become apparent from the following detailed description of illustrative embodiments thereof, which is to be read in connection with the accompanying drawings.

BRIEF DESCRIPTION OF DRAWINGS

This disclosure will present in detail the following description of preferred embodiments with reference to the following figures wherein:

FIG. 7 is a cross-sectional view of the device FIG. 5 after the conductive material is etched in accordance with the present invention;

FIG. 8 is a cross-sectional view of the device FIG. 7 after a dielectric material is deposited in accordance with the present invention;

FIG. 9 is a cross-sectional view of the device FIG. 8 after a bitline is connected to a bitline contact formed from the conductive material in accordance with the present invention;

DETAILED DESCRIPTION OF PREFERRED EMBODIMENTS

The present invention provides methods for fabricating a contact plug for stacked capacitor and/or bitline contacts for connections to bitlines in semiconductors memory devices, such as, for example, dynamic random access memories (DRAMs). Devices and methods are provided by the present invention to lower wordline to bitline capacitance and to improve wordline to bitline short yield. The methods of the present invention include many advantages over conventional bitline contact etch based plug formation.

The present invention provides the deposition of a conductive material, such as polysilicon, directly over gate structures and selectively removes the conductive material for contact plug formation. Dielectric materials are employed after the selective removal of the conductive material to fill gaps (spaces). Dielectric (BPSG) etching, as employed in the prior art, is advantageously avoided. This permits the use of silicon oxide as the cap (or liner) and spacer dielectric materials for the gate structures resulting in reduced bitline/wordline capacitance. In an embodiment, which employs polysilicon as the plug material, polysilicon may be selectively removed relative to silicon oxide. Selective etching of polysilicon to silicon oxide is preferred.

Some of the advantages include:
1. a lower wordline to bitline capacitance (e.g., by using an oxide spacer), e.g., reductions between about 10%–20% may be provided;
2. a reduced gate stack height (e.g., thinner cap oxide); e.g., reductions in height of between about 10%–20% may be realized;
3. a higher short yield (e.g., by eliminating a bitline contact etching step);
4. employing favorable etching strategies (e.g., polysilicon etching selective to oxide is favorable since selectivities of greater than, for example, 10 to 1 are achievable)); and
5. process complexity is maintained or improved by the present invention.

Figure 1:
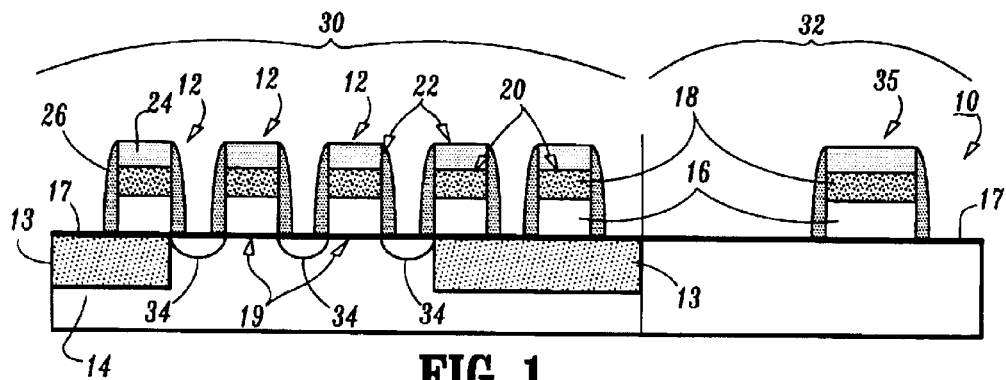
FIG. 1 is a cross-sectional view taken at section line 1—1 of FIG. 2 showing an array region and a support region of a semiconductor device with gate structures formed in accordance with the present invention.

Referring now in specific detail to the drawings in which like reference numerals identify similar or identical elements throughout the several views, and initially to FIG. 1, a cross-sectional view of a semiconductor memory device 10 (e.g., a DRAM) is shown in accordance with the present invention. A substrate 14 preferably includes monocrystalline silicon, although other substrate materials may be employed. Shallow trench isolation (STI) regions 13 are formed in substrate 14, and other structures such as wells, diffusion regions, trenches etc. may be formed prior to the state of device shown in FIG. 1. STI regions 13 may be filled with an oxide or other suitable dielectric material.

Gate structures 12 are formed over substrate 14 by depositing a layer of conductive material 16, such as, for example, polysilicon, and a more conductive material 18, such as tungsten silicide. A gate dielectric layer 17 is employed between substrate 14 and gate structures 12 to provide isolation between material layers 16 and 18 and a transistor channel 19 formed below gate structures. Material layers 16 and 18 are patterned to define gate conductors or wordlines 20 across a surface of device 10.

In accordance with the present invention, a dielectric layer 22 is deposited and a spacer etch is performed to provide cap 24 and spacers 26. Dielectric layer 22 preferably includes an oxide, such as silicon dioxide. The oxide employed for cap 24 and spacers 26 permits a thinner dielectric layer, then previously employed silicon nitride materials. In one example, silicon dioxide reduces the height of gate structures 12 by between about 10% and about 20% over the silicon nitride cap dielectric without losing dielectric strength.

Device 10 includes an array region 30 and a support region 32. Array region 30 includes memory cells for storing data, while support region 32 includes logic and on-chip support circuitry to provide address storing and retrieval of information from array 30. Gate structure 35 is formed in the same way as gate structures 12.

Figure 2:
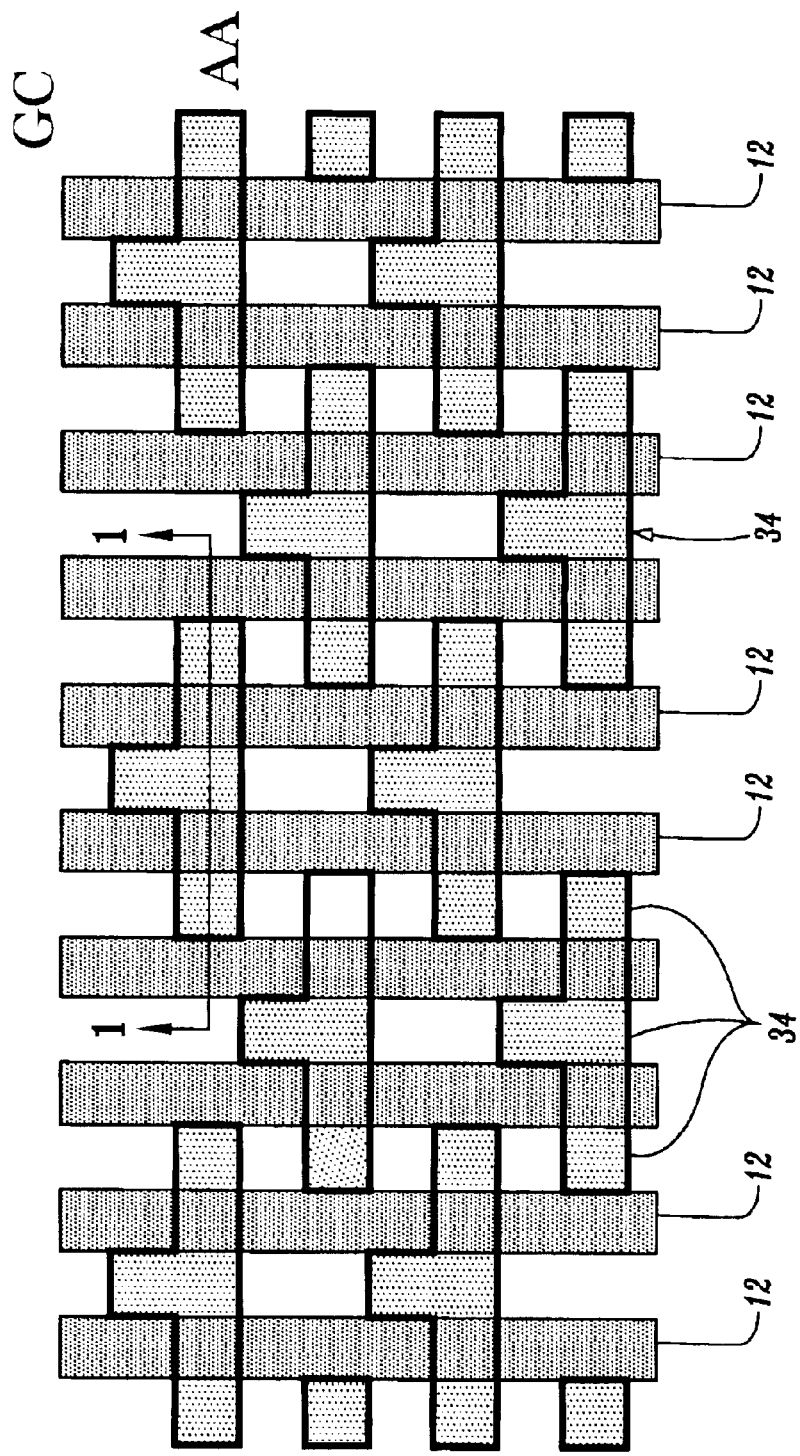
FIG. 2 is a top layout view showing active area regions relative to gate structures in accordance with the present invention.

Referring to FIGS. 1 and 2, diffusion regions (active areas) 34 are formed between gate structures 12. Diffusion regions 34 form sources and drains for transistor structures, which are employed, as access transistors for stacked capacitors. FIG. 2 shows a top layout view of device 10 showing, as an example, active areas 34 formed between gate structures 12 (wordlines) for 8 $F^2$ cells, where F is a groundrule (minimum feature size).

Figure 3:
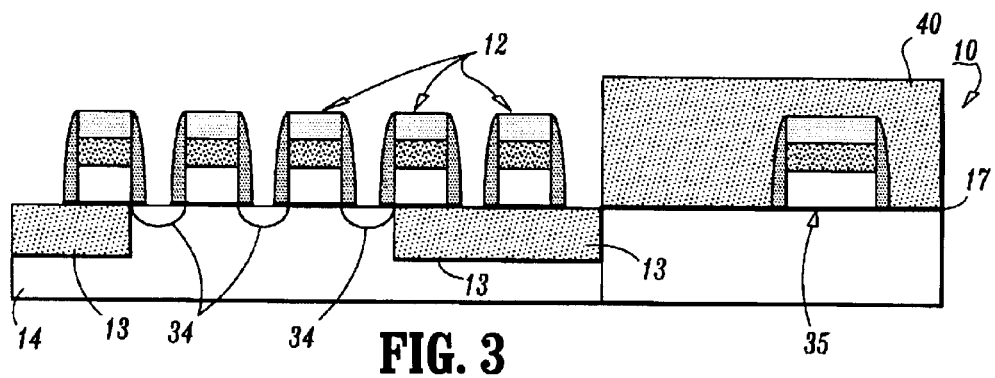
FIG. 3 is a cross-sectional view of the device FIG. 1 after dielectric material is removed in the array region between gate structures in accordance with the present invention.

Referring to FIG. 3, in one embodiment, support area 32 (FIG. 1) is optionally processed along with array region 30 (FIG. 1). A resist layer 40, such as a mid-ultraviolet resist (MUV) is deposited in support area 32 to protect gate dielectric 17. A screen etch is performed to remove gate dielectric 17 (e.g., oxide) from between gate structures 12. Resist layer 40 is removed.

Figure 4:
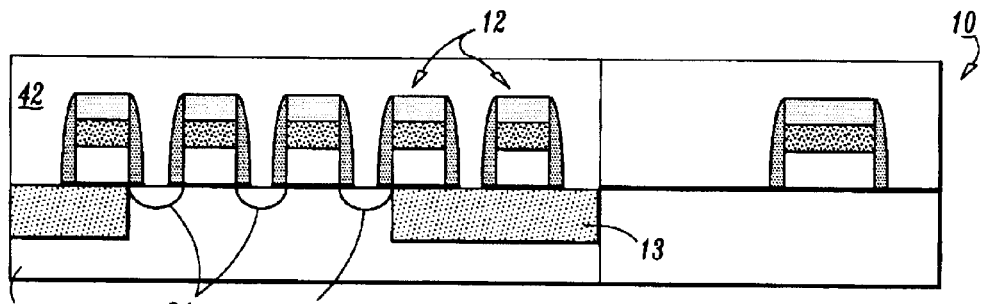
FIG. 4 is a cross-sectional view of the device FIG. 3 after a conductive material is deposited in accordance with the present invention.

Referring to FIG. 4, a conductive material 42 is deposited over gate structures 12 and 35. Material 42 preferably includes polysilicon. In this embodiment, material 42 is preferably deposited to a thickness greater than the height of gate stacks 12 (and 35), although the thickness may be equal to the height of gate stacks 12, as a lower limit.

Figure 5:
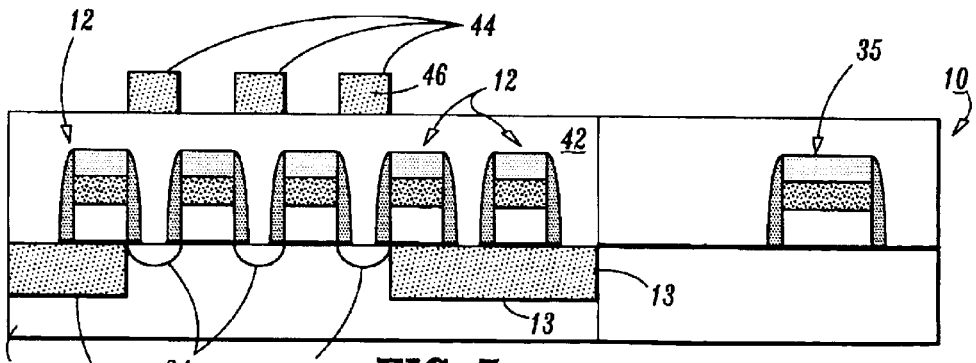
FIG. 5 is a cross-sectional view taken at section line 5—5 of FIG. 6 showing a contact mask formed on the conductive material in accordance with the present invention.
Figure 6:
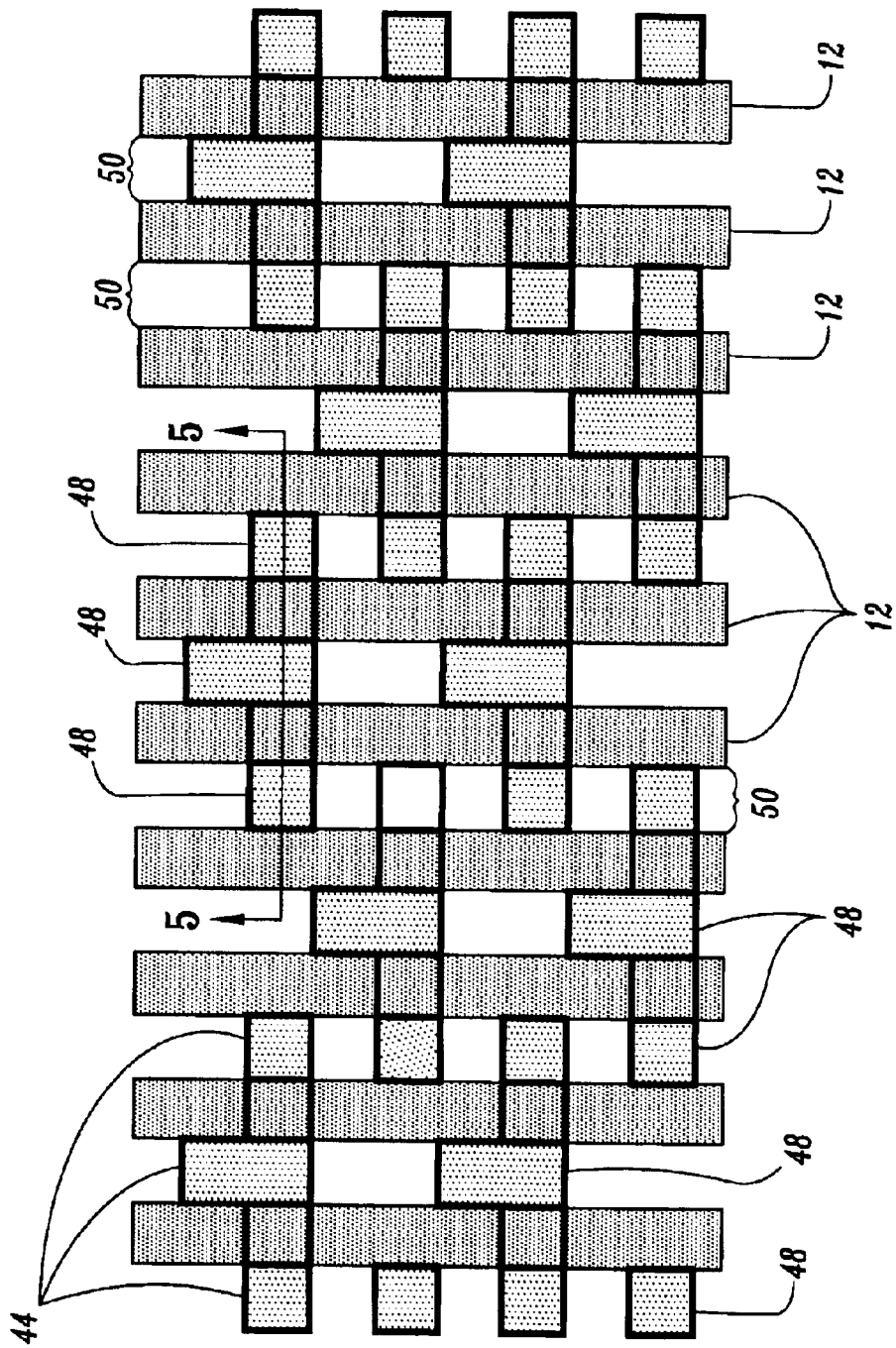
FIG. 6 is a top layout view showing the contact mask of FIG. 5 in accordance with the present invention.

Referring to FIGS. 5 and 6, a contact mask 44 is formed by depositing or spinning on resist material 46 and patterning resist material 46 to cover regions between gate structures 12 over active areas 34. Contact mask 44 may be lithographically patterned by known processes. Contact mask 44 preferably includes the same pattern as the active areas 34 shown in FIG. 2. Advantageously, contact mask 44 may include stripes or blocks 48 of resist which are thicker than gaps 50 between gate structures 12. In this way, additional tolerance is afforded the lithographic processing, which makes alignment of contact mask 44 to gate structures 12 relatively easy and highly reliable.

Referring to FIG. 7, an etching process, preferably a dry etch process, is performed to remove material 42, except from below contact mask 44. This leaves pillars or contacts 50 in contact with active areas 34 in substrate 14. Advantageously, etching of material 42, preferably polysilicon, is performed selective to oxide of caps 24 and spacers 26, which preferably include an oxide. Polysilicon to oxide etching is well-developed and reliable. The removal of polysilicon selective to oxide is very high (e.g., 10:1 or greater).

Referring to FIG. 8, a dielectric layer 52 is deposited in array area 30 and support area 32. Dielectric layer 52 preferably includes an oxide, such as BPSG, boron silicate glass (BSG) or other suitable oxides.

Referring to FIG. 9, dielectric layer 52 is patterned (etched) to open up a hole 53 down to contact 50a which is a bitline contact and a trench 55 for a bitline 54. Material for bitline 54 may be employed to complete the needed height for contact 50a. Material for bitline 54 extends to contact 50a and may include a metal, a metal silicide or polysilicon. In support area 32, wiring level contacts 56 and 58 are formed at the same time as bitlines 54 for device 10.

Figure 10:
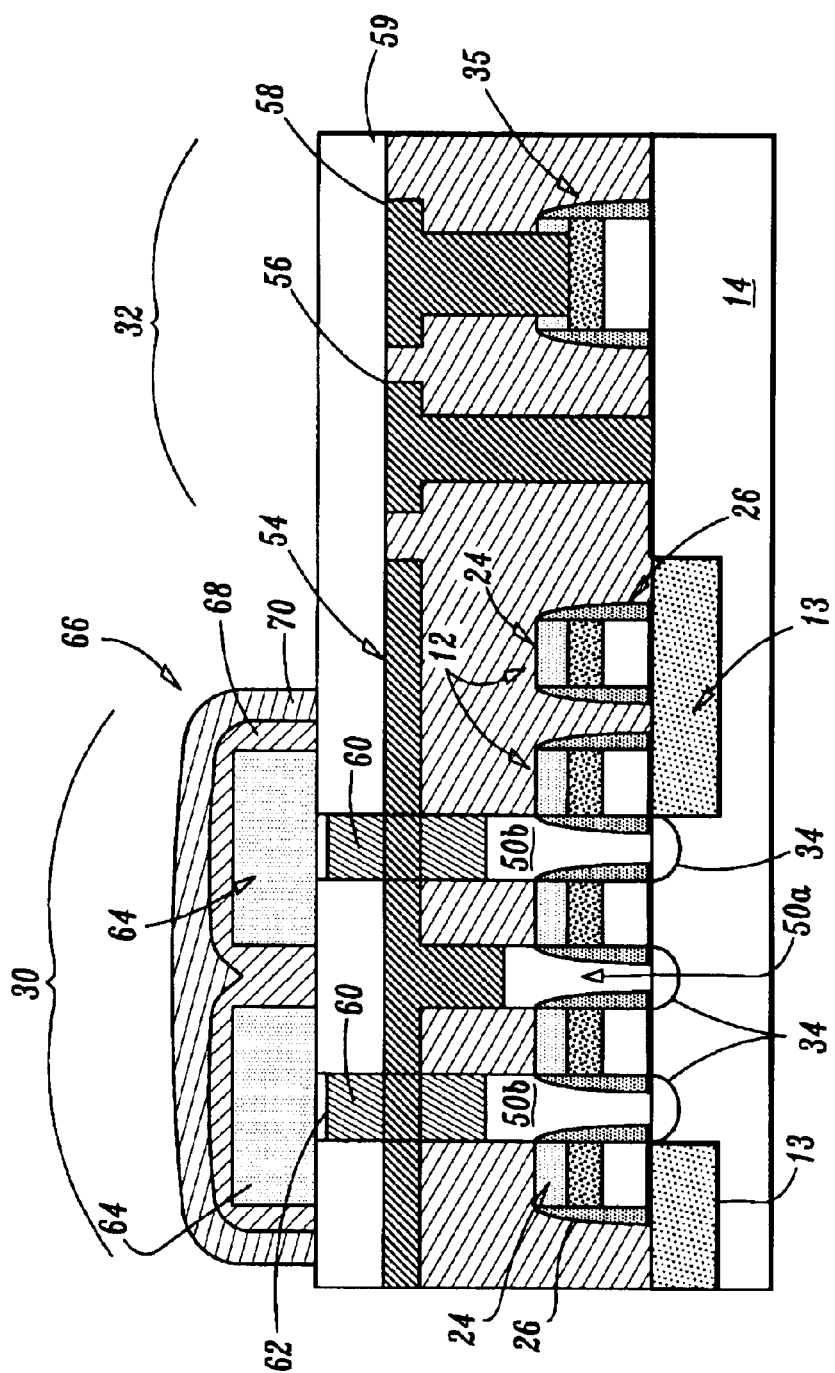
FIG. 10 is a cross-sectional view of the device FIG. 9 or 15 after plugs are formed for a stacked capacitor in accordance with the present invention.

Referring to FIG. 10, plugs 50b are extended by portions 60 through dielectric layers 52 and 59. Portions 60 may include polysilicon. A barrier layer 62 may be deposited between portion 60 and lower electrode 64 of stacked capacitor 66. Barrier layer 62 includes a diffusion barrier material such as TaN, TiN, or equivalent materials. Lower electrode 64 may include platinum or other inert metal materials. A capacitor dielectric 68 is formed over lower electrode 64 followed by a blanket deposition of a conductive material to form an upper electrode 70 for stacked capacitor 66. It is to be understood that plugs 50b are offset into the plane of the page from contact 50a and bitline 54. This permits no interference or electrical connection between bitline 54 and portions 60 over gate structures 12. In FIG. 10, portions 60 are behind or in front of bitline 54 and do not intersect with bitline 54. Portions 60 and bitline 54 are shown together for a better understanding of the invention.

Figure 11:
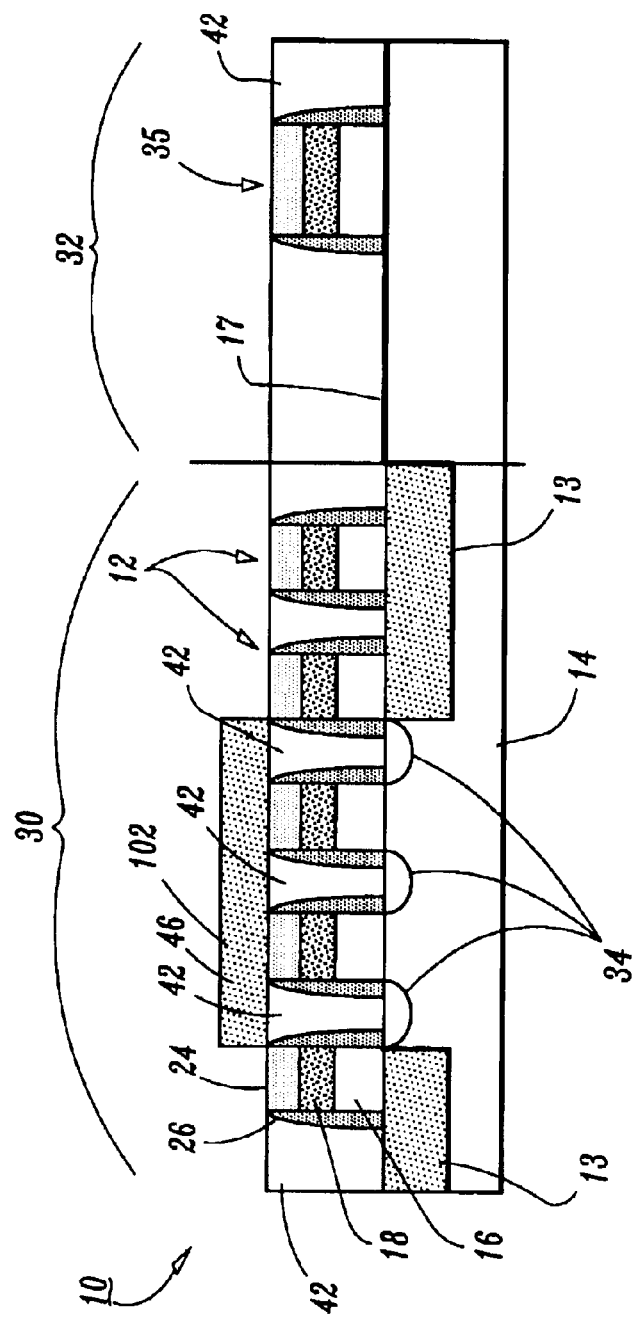
FIG. 11 is a cross-sectional view taken at section line 11—11 of FIG. 12, showing the device FIG. 4, after a conductive material is deposited and recessed by etching or planarization and showing a contact mask pattern formed in accordance with the present invention.

Referring to FIG. 11, an alternate embodiment of the present invention is shown. Beginning with the structure of device 10 shown in FIG. 4, material 42 is deposited to a thickness about equal to the height of gate stacks 12 (and 34), or material 42 is recessed to the height of gate stacks 12 (to gate cap level) by either etch back processing or chemical mechanical polishing (CMP).

Figure 12:
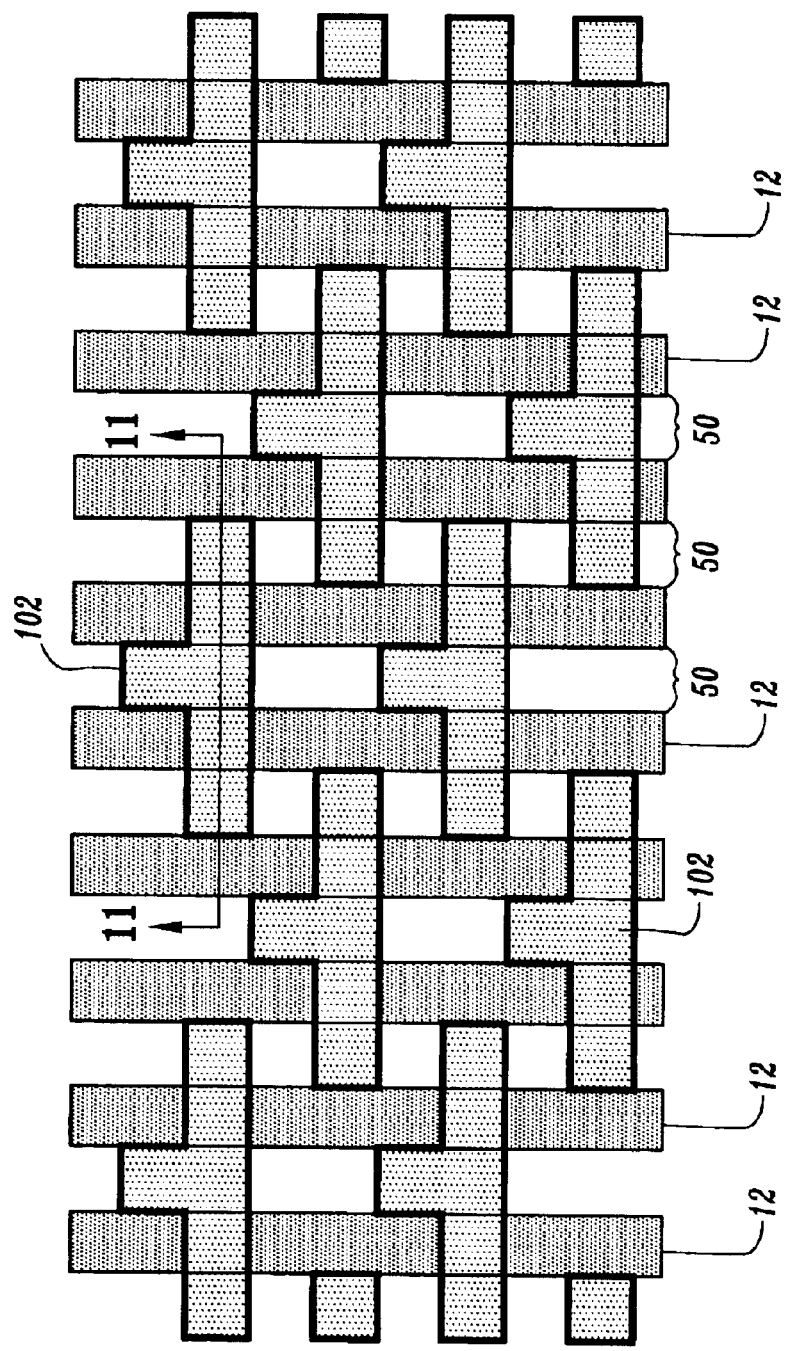
FIG. 12 is a top layout view showing the contact pattern mask of FIG. 11 in accordance with the present invention.

Referring to FIGS. 11 and 12, a contact pattern mask 102 is formed by depositing or spinning on resist material 46 and patterning resist material 46 to cover regions of gate structures 12 adjacent to active areas 34 and between gate structures 12 over active areas 34. Contact pattern mask 102 may be lithographically patterned by known processes. Contact mask 102 preferably includes the same pattern as the active areas 34 shown in FIG. 2. Advantageously, instead of contact mask 44, contact pattern mask 102, which has the identical AA mask shape (FIG. 2) is employed for better overlay control, since the etching of polysilicon (42) to cap 24 can be very selective. Layout of contact pattern mask 102 is shown in FIG. 12.

Figure 13:
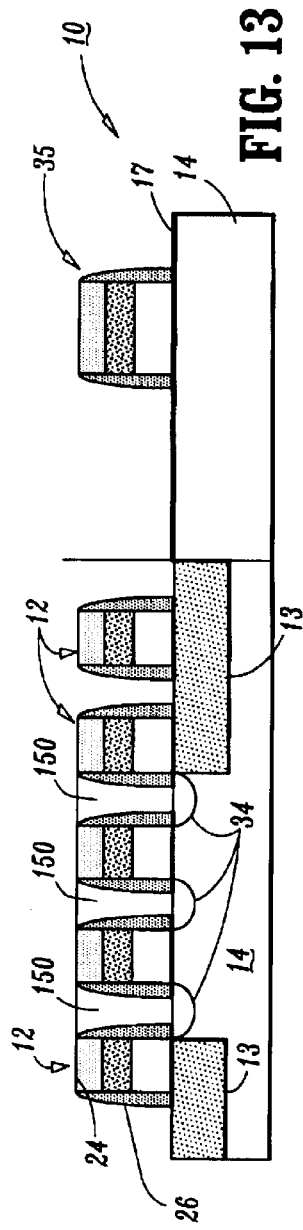
FIG. 13 is a cross-sectional view of the device FIG. 11 after the conductive material is etched in accordance with the present invention.

Referring to FIG. 13, an etching process, preferably a dry etch process, is performed to remove material 42, except from below contact pattern mask 102. This leaves pillars or contacts 150 in contact with active areas 34 in substrate 14. Advantageously, etching of material 42, preferably polysilicon, is performed selective to oxide of caps 24 and spacers 26, which preferably include an oxide. Polysilicon to oxide etching is well-developed and reliable. The removal of polysilicon selective to oxide is very high (e.g., 10:1 or greater).

Figure 14:
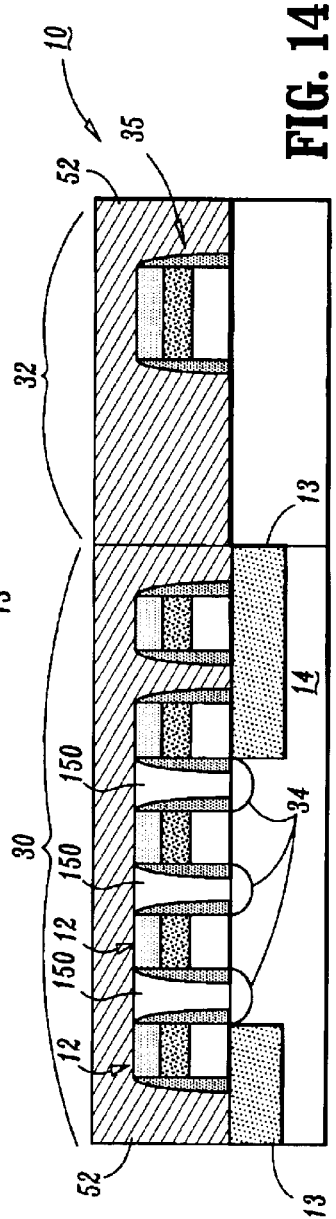
FIG. 14 is a cross-sectional view of the device FIG. 13 after a dielectric material is deposited in accordance with the present invention.

Referring to FIG. 14, a dielectric layer 52 is deposited in array area 30 and support area 32. Dielectric layer 52 preferably includes an oxide, such as BPSG, boron silicate glass (BSG) or other suitable oxides.

Figure 15:
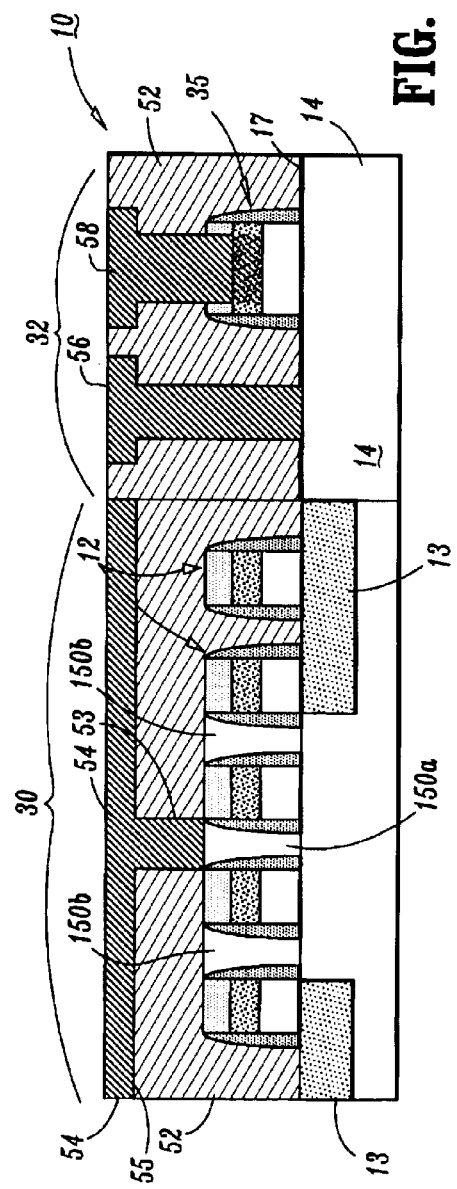
FIG. 15 is a cross-sectional view of the device FIG. 14 after a bitline is connected to a bitline contact formed from the conductive material in accordance with the present invention.

Referring to FIG. 15, dielectric layer 52 is patterned (etches) to open up a hole down 53 to contact 150a which is a bitline contact and a trench 55 for a bitline 54. Material for bitline 54 may be employed to complete the needed height for contact 150a. Material for bitline 54 may include a metal, a metal silicide or polysilicon. In support area 32, M0 level contacts 56 and 58 are formed at the same time as bitlines 54 for device 10. Plugs 150b (see sob in FIG. 10) and portions 60 are formed as described with reference to FIG. 10 above. Processing continues as is known in the art.

Since cap and spacer dielectric is maintained by the present invention, contact and plug formation for stacked capacitor DRAM devices provides lower wordline (WL) to bitline (BL) capacitance and improves WL to BL short yield. Reduced stack height of gate structures is achieved due to thinner cap dielectric, since oxide are preferably employed for cap and spacers of gate structures. Contact bitline etching is also eliminated since gate structures are employed for formation of contacts and plugs.

Having described preferred embodiments for contact plug formation for devices with stacked capacitors (which are intended to be illustrative and not limiting), it is noted that modifications and variations can be made by persons skilled in the art in light of the above teachings. It is therefore to be understood that changes may be made in the particular embodiments of the invention disclosed which are within the scope and spirit of the invention as outlined by the appended claims. Having thus described the invention with the details and particularity required by the patent laws, what is claimed and desired protected by Letters Patent is set forth in the appended claims.

What is claimed is:

1. A method for fabricating a semiconductor device comprising the steps of:

providing parallel gate structures formed on a substrate with spaces between the gate structures;

blanket depositing a conductive material to fill the spaces and cover the gate structures such that contact with the substrate is made by the conductive material;

patterning a mask to remain over active area regions, the mask remaining over the spaces;

removing the conductive material in accordance with the mask to provide contacts formed from the conductive material which fills the spaces over the active areas;

depositing a dielectric layer over the gate structures and over the contacts; forming holes down to the contacts; and connecting a conductive region to the contacts through the holes, wherein the conductive material includes polysilicon and the gate structures include dielectric caps and spacers formed from an oxide, and wherein the step of removing the conductive material includes etching polysilicon selective to the oxide of the caps and spacers of the gate structures.

2. The method as recited in claim 1, wherein the contacts include plugs for stacked capacitors.

3. The method as recited in claim 1, wherein the contacts include bitline contacts.

4. The method as recited in claim 1, wherein the step of removing the conductive material includes the step of removing the conductive material in accordance with the mask to provide contacts extending above a height of the gate structures.

5. The method as recited in claim 1, wherein the step of patterning a mask includes the step of patterning the mask into stripes running parallel to the gate structures over the spaces.

6. The method as recited in claim 1, wherein the step of patterning a mask includes the step of patterning the mask into a same shape as an layout area occupied by active areas in the substrate, the mask extending over the gate structures and over the spaces.

7. A method for fabricating a semiconductor device, comprising the steps of:

provided parallel gate structures disposed on a substrate with spaces between the gate structures;

blanket depositing polysilicon in the spaces and over the gate structures such that contact with the substrate is made by the polysilicon;

patterning a contact mask such that stripes are formed over the spaces, which are over active areas;

removing the polysilicon in accordance with the mask to provide contacts formed from the polysilicon having a height greater than a height of the gate structures in the spaces over the active areas;

depositing a dielectric layer over the gate structures and over the contacts;

forming holes down to the contacts; and connecting a conductive region to the contacts through the holes, wherein the gate structures include dielectric caps and spacers formed from an oxide and the step of removing the polysilicon includes the etching polysilicon selective to the oxide of the caps and spacers of the gate structures.

8. The method as recited in claim 7, wherein the contacts include plugs for stacked capacitors.

9. The method as recited in claim 7, wherein the contacts include bitline contacts.

10. The method as recited in claim 7, wherein the conductive region includes one of a bitline and a capacitor electrode.

11. A method for fabricating a semiconductor device, comprising the steps of:

providing parallel gate structures disposed on a substrate with spaces between the gate structures;

depositing polysilicon in the spaces and over the gate structures such that contact with the substrate is made by the polysilicon;

patterning a contact mask such that the contact mask covers a same layout area over the spaces and the gate structures as an active area formed in the substrate;

removing the polysilicon in accordance with the mask to provide contacts in the spaces over the active areas, the contacts being formed from the polysilicon having about a same height as the gate structures;

depositing a dielectric layer over the gate structures and over the contacts;

forming holes down to the contacts; and connecting a conductive region to the contacts through the holes, wherein the gate structures include dielectric caps and spacers formed from an oxide and the step of removing the polysilicon includes the etching polysilicon selective to the oxide of the caps and spacers of the gate structures.

12. The method as recited in claim 11, wherein the contacts include plugs for stacked capacitors.

13. The method as recited in claim 11, wherein the contacts include bitline contacts.

14. The method as recited in claim 11, wherein the conductive region includes one of a bitline and a capacitor electrode.

15. The method as recited in claim 11, wherein the step of removing the polysilicon includes planarizing the polysilicon to the same height as the gate structures.

* * * * *